(12) United States Patent
England et al.

(10) Patent No.: US 9,711,494 B2
(45) Date of Patent: Jul. 18, 2017

(54) METHODS OF FABRICATING SEMICONDUCTOR DIE ASSEMBLIES

(71) Applicant: Micron Technology, Inc., Boise, ID (US)

(72) Inventors: Luke G. England, Saratoga Springs, NY (US); Paul A. Silvestri, Chandler, AZ (US); Michel Koopmans, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/600,976

(22) Filed: Jan. 20, 2015

(65) Prior Publication Data

US 2015/0132869 A1    May 14, 2015

Related U.S. Application Data

(62) Division of application No. 13/205,344, filed on Aug. 8, 2011, now Pat. No. 8,937,309.

(51) Int. Cl.
| | |
|---|---|
| *H01L 21/00* | (2006.01) |
| *H01L 23/00* | (2006.01) |
| *H05K 1/00* | (2006.01) |
| *H01L 25/00* | (2006.01) |
| *H01L 21/56* | (2006.01) |

(Continued)

(52) U.S. Cl.
CPC ............ *H01L 25/50* (2013.01); *H01L 21/561* (2013.01); *H01L 21/568* (2013.01); *H01L 21/78* (2013.01); *H01L 22/14* (2013.01); *H01L 22/20* (2013.01); *H01L 23/544* (2013.01); *H01L 24/89* (2013.01); *H01L 24/96* (2013.01); *H01L 25/0657* (2013.01); *H01L 25/18* (2013.01); *H01L 21/6835* (2013.01); *H01L 21/6836* (2013.01); *H01L 22/32* (2013.01); *H01L 23/3107* (2013.01); *H01L 23/3121* (2013.01); *H01L 2221/6834* (2013.01); *H01L 2221/68327* (2013.01); *H01L 2223/54433* (2013.01); *H01L 2224/16145* (2013.01); *H01L 2224/80203* (2013.01); *H01L 2224/80815* (2013.01); *H01L 2225/06513* (2013.01); *H01L 2225/06541* (2013.01); *H01L 2225/06596* (2013.01); *H01L 2924/12042* (2013.01)

(58) Field of Classification Search
CPC ....................................................... H01L 25/00
USPC ............................................................ 438/17
See application file for complete search history.

(56) References Cited

U.S. PATENT DOCUMENTS

| | | |
|---|---|---|
| 5,953,588 A | 9/1999 | Camien et al. |
| 6,339,255 B1 | 1/2002 | Shin |

(Continued)

FOREIGN PATENT DOCUMENTS

| | | |
|---|---|---|
| JP | 2003273172 A | 9/2003 |
| JP | 2005051150 A | 2/2005 |

(Continued)

*Primary Examiner* — John C Ingham
*Assistant Examiner* — Ismail Muse
(74) *Attorney, Agent, or Firm* — TraskBritt (57) ABSTRACT

Methods of fabricating multi-die assemblies including a base semiconductor die bearing a peripherally encapsulated stack of semiconductor dice of lesser lateral dimensions, the dice vertically connected by conductive elements between the dice, resulting assemblies, and semiconductor devices comprising such assemblies.

16 Claims, 7 Drawing Sheets

(51) Int. Cl.
*H01L 23/544* (2006.01)
*H01L 25/065* (2006.01)
*H01L 25/18* (2006.01)
*H01L 21/78* (2006.01)
H01L 23/31 (2006.01)
H01L 21/66 (2006.01)
H01L 21/683 (2006.01)

(56) References Cited

U.S. PATENT DOCUMENTS

| | | | |
|---|---|---|---|
| 6,459,159 B1 | 10/2002 | Miyagawa et al. | |
| 6,577,013 B1 | 6/2003 | Glenn et al. | |
| 6,652,799 B2 | 11/2003 | Seng et al. | |
| 6,849,932 B2 | 2/2005 | Tsai | |
| 7,015,572 B2 | 3/2006 | Yamaji | |
| 7,180,166 B2 | 2/2007 | Ho et al. | |
| 7,276,799 B2 | 10/2007 | Lee et al. | |
| 7,388,294 B2 | 6/2008 | Klein et al. | |
| 7,576,433 B2 | 8/2009 | Ishino et al. | |
| 7,595,017 B2 | 9/2009 | Siegel et al. | |
| 7,638,362 B2 | 12/2009 | Ishino et al. | |
| 7,675,181 B2 | 3/2010 | Lee | |
| 7,723,213 B2 | 5/2010 | Ichikawa | |
| 7,749,807 B2 | 7/2010 | Karnezos | |
| 7,820,483 B2 | 10/2010 | Belanger et al. | |
| 7,825,517 B2 | 11/2010 | Su | |
| 7,838,337 B2 | 11/2010 | Marimuthu et al. | |
| 7,915,710 B2 | 3/2011 | Lee et al. | |
| 8,110,910 B2 | 2/2012 | Kim | |
| 8,143,719 B2 | 3/2012 | Toh et al. | |
| 8,154,135 B2 | 4/2012 | Kim et al. | |
| 8,274,143 B2 | 9/2012 | Fujishima et al. | |
| 8,294,281 B2 | 10/2012 | Yoshida et al. | |
| 8,324,733 B2 | 12/2012 | Lee et al. | |
| 8,445,918 B2 | 5/2013 | Bartley et al. | |
| 8,552,567 B2 | 10/2013 | England et al. | |
| 8,786,066 B2 | 7/2014 | Guzek et al. | |
| 2002/0074637 A1 | 6/2002 | McFarland | |
| 2003/0107119 A1 | 6/2003 | Kim | |
| 2005/0046002 A1 | 3/2005 | Lee et al. | |
| 2005/0048698 A1* | 3/2005 | Yamaguchi | H01L 21/76898 438/109 |
| 2005/0263869 A1 | 12/2005 | Tanaka et al. | |
| 2006/0038272 A1* | 2/2006 | Edwards | H01L 23/481 257/686 |
| 2006/0063312 A1 | 3/2006 | Kurita | |
| 2006/0125083 A1* | 6/2006 | Ogawa | H01L 21/4857 257/700 |
| 2006/0197181 A1 | 9/2006 | Noguchi | |
| 2006/0223232 A1 | 10/2006 | Egawa | |
| 2006/0275957 A1 | 12/2006 | Shibata | |
| 2007/0090517 A1 | 4/2007 | Moon et al. | |
| 2007/0184583 A1* | 8/2007 | Egawa | H01L 21/561 438/113 |
| 2007/0194455 A1 | 8/2007 | Ikeda et al. | |
| 2007/0222050 A1 | 9/2007 | Lee et al. | |
| 2007/0252257 A1 | 11/2007 | Baek et al. | |
| 2008/0054489 A1* | 3/2008 | Farrar | H01L 23/3121 257/777 |
| 2008/0079150 A1 | 4/2008 | Simon et al. | |
| 2008/0153187 A1* | 6/2008 | Luo | G01R 31/2886 438/17 |
| 2008/0237310 A1 | 10/2008 | Periaman et al. | |
| 2008/0303031 A1 | 12/2008 | Toh et al. | |
| 2008/0318361 A1 | 12/2008 | Han et al. | |
| 2009/0001598 A1 | 1/2009 | Chiou et al. | |
| 2009/0004777 A1 | 1/2009 | Kolan et al. | |
| 2009/0032966 A1* | 2/2009 | Lee | H01L 21/76898 257/774 |
| 2009/0079067 A1 | 3/2009 | Gerber | |
| 2009/0102038 A1 | 4/2009 | McElrea et al. | |
| 2009/0321948 A1* | 12/2009 | Wang | H01L 24/33 257/777 |
| 2010/0014263 A1* | 1/2010 | Tsuchida | C08G 59/4035 361/773 |
| 2010/0052157 A1 | 3/2010 | Pratt | |
| 2010/0090338 A1 | 4/2010 | Lee et al. | |
| 2010/0144094 A1 | 6/2010 | Chen et al. | |
| 2010/0148316 A1 | 6/2010 | Kim et al. | |
| 2010/0171208 A1 | 7/2010 | Fujii | |
| 2010/0187670 A1* | 7/2010 | Lin | H01L 21/76898 257/686 |
| 2010/0187683 A1 | 7/2010 | Bakir et al. | |
| 2010/0224966 A1 | 9/2010 | Chen | |
| 2010/0258933 A1 | 10/2010 | Fujishima et al. | |
| 2010/0279463 A1 | 11/2010 | Hsiao et al. | |
| 2010/0314737 A1 | 12/2010 | Henderson et al. | |
| 2010/0327439 A1 | 12/2010 | Hwang et al. | |
| 2011/0042820 A1 | 2/2011 | Knickerbocker | |
| 2011/0057327 A1 | 3/2011 | Yoshida et al. | |
| 2011/0079923 A1 | 4/2011 | Suh | |
| 2011/0089573 A1 | 4/2011 | Kurita | |
| 2011/0147945 A1* | 6/2011 | Yoshida | H01L 21/561 257/774 |
| 2011/0193229 A1* | 8/2011 | Ma | H01L 21/561 257/738 |
| 2011/0291246 A1 | 12/2011 | Jo et al. | |
| 2012/0074581 A1 | 3/2012 | Guzek et al. | |
| 2012/0193779 A1* | 8/2012 | Lee | H01L 23/3135 257/737 |
| 2012/0326170 A1* | 12/2012 | Liu | H01L 25/167 257/82 |
| 2013/0026643 A1 | 1/2013 | England et al. | |
| 2013/0037802 A1 | 2/2013 | England et al. | |
| 2014/0017823 A1 | 1/2014 | England et al. | |
| 2014/0353815 A1 | 12/2014 | England et al. | |

FOREIGN PATENT DOCUMENTS

| | | |
|---|---|---|
| JP | 2006245311 A | 9/2006 |
| JP | 2006278817 A | 10/2006 |
| JP | 2007115922 A | 5/2007 |
| JP | 2009004730 A | 1/2009 |
| JP | 2010103195 A | 5/2010 |
| JP | 2010165984 A | 7/2010 |
| JP | 2010245289 A | 10/2010 |
| KR | 1020110036150 A | 4/2011 |
| WO | 2004102653 A1 | 11/2004 |
| WO | 2008108334 A1 | 9/2008 |
| WO | 2010080068 A1 | 7/2010 |
| WO | 2011025894 A1 | 3/2011 |

\* cited by examiner

METHODS OF FABRICATING SEMICONDUCTOR DIE ASSEMBLIES

CROSS-REFERENCE TO RELATED APPLICATION

This application is a divisional of U.S. patent application Ser. No. 13/205,344, filed Aug. 8, 2011, now U.S. Pat. No. 8,937,309, issued Jan. 20, 2015, the disclosure of which is hereby incorporated herein in its entirety by this reference.

Embodiments of the present disclosure relate to semiconductor die assemblies, to semiconductor devices including such assemblies, and to methods of fabrication of the assemblies.

BACKGROUND

Increased circuit density is an ongoing goal of manufacturers of semiconductor devices. One long-favored configuration is an assembly of vertically stacked semiconductor dice, at least some of which are interconnected electrically and the stacked die assembly being mechanically and electrically connected to higher level packaging, such as an interposer or other substrate bearing conductive traces.

One configuration employing a plurality of stacked semiconductor dice is a MicroPillar Grid Array ("MPGA") package. Such a package comprises a stack of a plurality (for example, four (4)) of dynamic random access (DRAM) semiconductor memory dice vertically interconnected from an uppermost die to a lowermost die, and a plurality of conductive pillars extending from the underside of the lowermost memory die for connection to a logic die or a System on a Chip (SoC) die.

The provider of the logic die or the SoC die conventionally mounts their device to an interposer, such as a ball grid array (BGA) substrate, the logic or SoC die including conductive through vias for connection to the conductive pillars on the underside of the MPGA. The MPGA is mounted to the logic die or SoC die on the interposer, and the assembly is then overmolded with an encapsulant into a finished BGA package.

The aforementioned configuration, implemented as a so-called "Wide I/O" memory device, enables fast memory access, and reduces power requirements.

The end product finds application, among others, in mobile electronic devices such as so-called "smart phones" exemplified by BLACKBERRY® devices, IPHONE® devices, and DROID® devices, among others.

DETAILED DESCRIPTION

Semiconductor die assemblies are disclosed, semiconductor devices including same, and methods of fabricating same. As used herein, the term "wafer" means and includes a volume of a semiconductor material in the form of a bulk semiconductor substrate, and is not limited to conventional, substantially circular wafers. As used herein, the term "semiconductor material" means and includes silicon, germanium, gallium arsenide, indium phosphide, and other III-V or II-VI type semiconductor materials. As used herein, the terms "semiconductor die" and "die," and plural forms thereof, mean and include a segment or segments bearing integrated circuitry and singulated from a bulk semiconductor substrate. As used herein, the term "memory die," and plural forms thereof, means and includes all forms of integrated circuit memory, by way of non-limiting example, including DRAM, SRAM, Flash memory, and other memory forms. While only a few semiconductor dice and associated wafer segments are depicted in the drawing figures for clarity, it is of course conventional that hundreds or even thousands of dice may be fabricated on, and singulated from, a single source wafer.

The following description provides specific details, such as material types and processing conditions in order to provide a thorough description of embodiments of the present disclosure. However, a person of ordinary skill in the art will understand that the embodiments of the present disclosure may be practiced without employing these specific details. Indeed, the embodiments of the present disclosure may be practiced in conjunction with conventional semiconductor fabrication techniques employed in the industry. In addition, the description provided below does not form a complete process flow for manufacturing a semiconductor device. Only those process acts and structures necessary to understand the embodiments of the present disclosure are described in detail below. Additional acts to form a complete semiconductor device from the semiconductor structures may be performed by conventional fabrication techniques.

In the following detailed description, reference is made to the accompanying drawings, which form a part hereof, and in which is shown, by way of illustration, specific embodiments in which the present disclosure may be practiced. These embodiments are described in sufficient detail to enable a person of ordinary skill in the art to implement embodiments of the present disclosure. However, other embodiments may be implemented, and structural, logical, and electrical changes encompassed by the disclosure may be made. The illustrations presented herein are not meant to be actual views of any particular assembly, memory device, logic device, or system, but are merely idealized representations that are employed to more completely describe the embodiments of the present disclosure. The drawings presented herein are not necessarily drawn to scale. Additionally, elements common between drawings may retain the same or a similar numerical designation.

Employing a fabrication process of the present disclosure offers significant advantages to stacked die assemblies, including, without limitation, MPGA packages. For example, the use of an intact wafer comprising unsingulated semiconductor dice, which is singulated after additional semiconductor dice are stacked thereon, facilitates wafer level processing without the use of a separate supporting structure remaining with the assembly after fabrication of stacked die packages and, thus, reduces the thickness thereof. In one embodiment, the stacked die package may have a stack height of about 280 μm. In addition, the minimized, lateral (X-Y plane) footprint of a completed stacked die package is literally "chip scale." The back side of a semiconductor die at the top of each stacked die package, which back side does not include active circuitry and which die does not include conductive through vias, may be laser marked. An encapsulation structure extending around the semiconductor dice of each stack and between the die stacks above the intact wafer provides mechanical support and protection for relatively thin and fragile stacked semiconductor dice during test of the die stacks at wafer level. The peripheral encapsulation material around the stacked semiconductor dice after singulation provides good mechanical protection during subsequent handling and manufacturing, while exposure of the back side of the top die of each die stack by removal of the portion of the encapsulation structure over it may facilitate heat transfer. The die-to-wafer process employed for stacking singulated dice on an intact wafer results in the ability to use wafer level processes downstream, enabling higher throughput and reduced costs. In addition, the use of an intact wafer as a platform for the die stacks allows for a larger and more accurate step size, due to the larger die pitch enabled by the use of the stacks of semiconductor dice on a wafer during wafer level packaging, so that testing at the wafer level is facilitated and a standard scribe width may be employed for singulation. Further, the use of known good die minimizes packaging cost.

One embodiment comprises a method of forming a semiconductor die assembly, comprising stacking at least one level of semiconductor dice having conductive through vias over unsingulated, laterally separated semiconductor die locations of a wafer and stacking another level of semiconductor dice without conductive through vias over uppermost semiconductor dice of the at least one level. The semiconductor dice in each level and an associated unsingulated semiconductor die location are vertically connected with conductive elements, and a dielectric material placed between the semiconductor dice of each stack and the associated unsingulated die location. At least a periphery of each stack of semiconductor dice is covered with encapsulant material between the stacks and onto the wafer and the stacks of semiconductor dice are singulated through the encapsulant material between the stacks of semiconductor dice and through the wafer.

Another embodiment comprises a method of forming a semiconductor die assembly, comprising forming stacks of semiconductor dice over laterally separated semiconductor die locations of a wafer, an uppermost semiconductor die of each stack having an active surface facing the wafer and having no conductive through vias. Semiconductor dice in each stack and of a semiconductor die location under each stack are vertically connected with conductive elements and a dielectric material placed around the conductive elements. Each stack is substantially simultaneously encapsulated with a molded dielectric material over and between the stacks in contact with the wafer, the dielectric material over the stacks is removed and the uppermost semiconductor die of each stack thinned. The dielectric material and the wafer are severed between the stacks.

A process flow for fabrication of semiconductor die assemblies is depicted in FIGS. 1A through 1L.

Figure 1A:
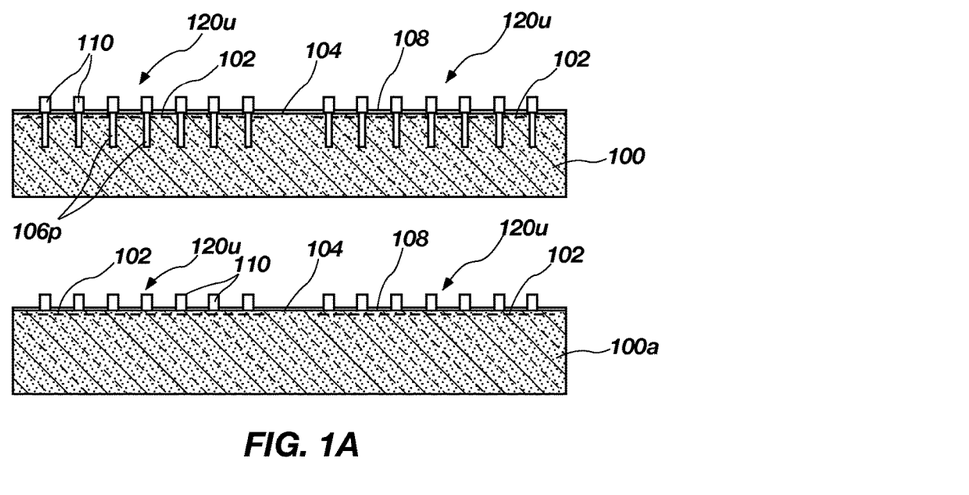
FIGS. 1A through 1L illustrate embodiments of a method for forming a semiconductor structure according to the present disclosure.
Figure 1B:
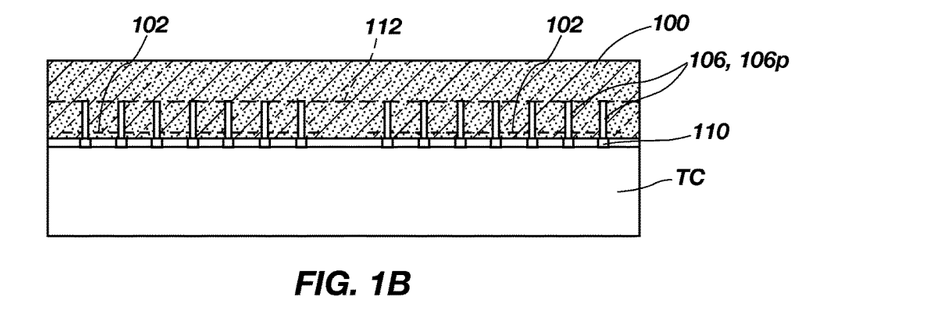

As depicted in FIG. 1A, wafers 100 and 100a of a semiconductor material, such as silicon and of a thickness, for example, of about 700 μm to about 800 μm, each have integrated circuitry 102 of a plurality of unsingulated semiconductor dice 120u fabricated on an active surface 104. Unsingulated semiconductor dice 120u on each wafer 100 and 100a have been previously tested to identify the locations of known good die (KGD) on each wafer. A KGD has been tested according to specific performance parameters for the intended application for the die. In the described embodiment, semiconductor dice 120 are memory dice, but the disclosure is not so limited.

All of the semiconductor dice employed in forming a die stack according to embodiments of the disclosure are prequalified as KGD. A wafer 100 includes conductive through via precursor structures 106p, for example, of copper, extending through wafer 100 at the locations of unsingulated semiconductor dice 120u, while a wafer 100a lacks such via precursor structures 106p. Through via precursor structures 106p are electrically isolated from one another, and from the peripherally surrounding semiconductor material of wafer 100.

As shown in FIG. 1A, wafers 100 and 100a may have a passivation material 108 applied thereto such as a polyimide, polybenzoxazole (PBO), or bismaleimide triazine (BT) resin, or a low temperature silicon nitride or a silicon oxide, and electrically conductive elements 110 comprising metal pillars, which may also be characterized as columns or studs, or solder balls, may be formed in contact with conductive via precursor structures 106p of wafer 100 and with integrated circuitry of wafers 100 and 100a through aligned openings in passivation material 108. If metal pillars are employed, copper, as one suitable material, may be electroplated on a seed layer (not shown) over passivation material 108, or sputtered onto passivation material 108, as is conventional. Electrically conductive elements 110 may then be formed by masking, patterning of the mask, and removal of the unmasked electrically conductive material by a conventional technique, such as etching, to form pillars. Another approach for pillar formation is application of a seed layer, masking of the seed layer, and forming pillars by electroplating on the unmasked seed layer, followed by optional removal of the mask and unplated seed layer. If solder balls are employed, segments of a solder paste may be applied to metallic pads, for example, of nickel, and commonly termed "under bump metallization" (UBM) formed or otherwise disposed in contact with conductive via precursor structures through openings in passivation material 108. The solder paste may be reflowed to form solder balls, or preformed solder balls may be applied to the pads and reflowed sufficiently to bond thereto. By way of example only, electrically conductive elements 110 in the form of 20 μm diameter copper pillars may be employed, at a 40 μm minimum pitch.

Wafer 100 may be mounted on a temporary carrier TC (see FIG. 1B) as known in the art and thinned as indicated at broken line T to expose the ends of conductive through via precursor structures 106p on a back side 112 of each wafer 100, forming conductive through vias 106, which may also be referred to for the sake of convenience using the industry term "through silicon vias," or "TSVs," and which extend to the back side 112 of wafer 100. Conductive through vias 106 may be formed using conventional techniques. For example, through vias may be formed in a desired pattern using wafer level processing after fabrication of integrated circuitry 102 partially through a wafer at a location of each unsingulated semiconductor die 120u by etching, then lined with a dielectric, and lined or filled with a conductive material. The wafer 100 may then be back ground to a depth near the ends of the conductive through via precursor structures 106p within the wafer 100, and silicon dry-etched, for example, by a fluorine or chlorine-based reactive ion etching (RIE) process to expose the conductive via ends, resulting in a die of about 50 μm thickness, by way of non-limiting example.

Figure 1C:
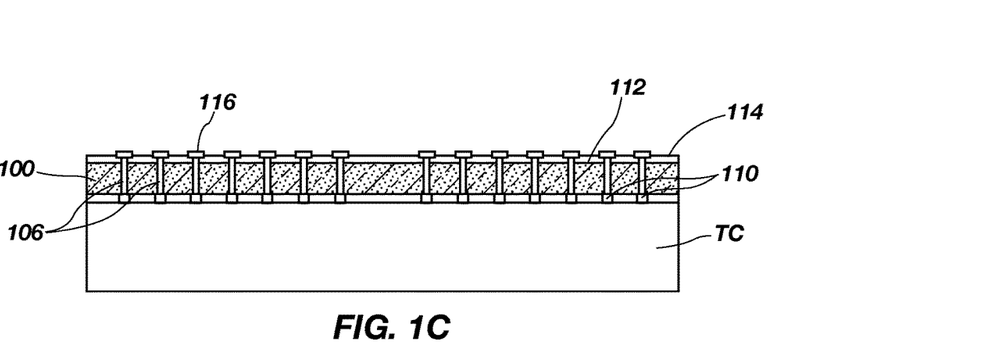

FIG. 1C depicts coating of the back side 112 of a thinned wafer 100 with a polymer passivation material 114 such as a polyimide, PBO or BT resin, or a low temperature silicon nitride or silicon oxide. Solderable interconnects in the form of landing pads 116, for example, of nickel on the ends of conductive through vias 106 comprising copper, may then be formed by depositing a metal seed layer over passivation material 114, masking the desired trace and/or pad pattern with photoresist, electroplating metal on the passivation material 114, and stripping of the photoresist and underlying metal seed layer. The landing pads 116 are aligned and connected with electrically conductive elements 110 of wafer 100 through openings in passivation material 114 to conductive through vias 106 of their respective unsingulated semiconductor die 120*u*. By employing a common pattern of conductive through vias 106, electrically conductive elements 110 and landing pads 116 with all semiconductor dice 120 and 120*u* in a stack and with connections to a logic die or a SoC die, as will be described hereafter, extremely short vertical connections throughout a resulting semiconductor device may be achieved. Of course, if conductive through vias 106 of a given semiconductor die to be used in a die stack are not aligned with those of an adjacent semiconductor die in the stack, a redistribution layer (RDL) comprising conductive traces may be formed, leading to landing pads 116 positioned for contact with electrically conductive elements 110 of the adjacent die.

Figure 1D:
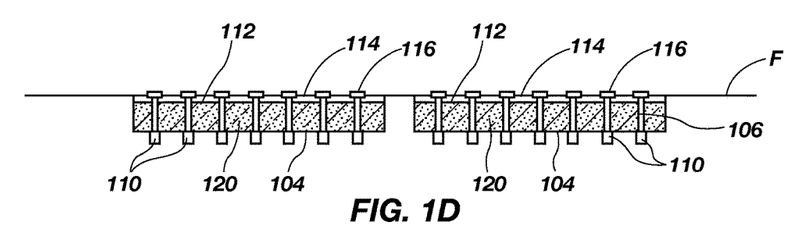

As shown in FIG. 1D, some thinned wafers 100 may be mounted to a film frame F, and temporary carrier TC removed. The thinned wafer 100 is then singulated into individual dice 120. Another thinned wafer 100 remains intact, in wafer form on a temporary carrier TC, as shown in FIG. 1E.

Figure 1E:
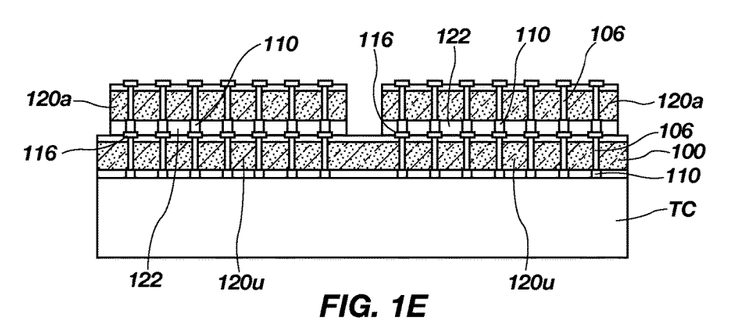

In FIG. 1E, singulated semiconductor dice 120*a* having electrically conductive elements 110 thereon having been removed from a film frame by, for example, a pick-and-place apparatus are mounted to a intact wafer 100 supported by a temporary carrier TC in laterally spaced relationship over locations of unsingulated dice 120*u* of the intact wafer 100, with electrically conductive elements 110 of semiconductor dice 120*a* in alignment with landing pads 116 over conductive through vias 106 of unsingulated dice 120*u*. A no-flow non-conductive epoxy underfill 122*u* is pre-applied to an active surface of each singulated semiconductor die 120*a* before it is placed on an unsingulated semiconductor die 120*u*.

Figure 1F:
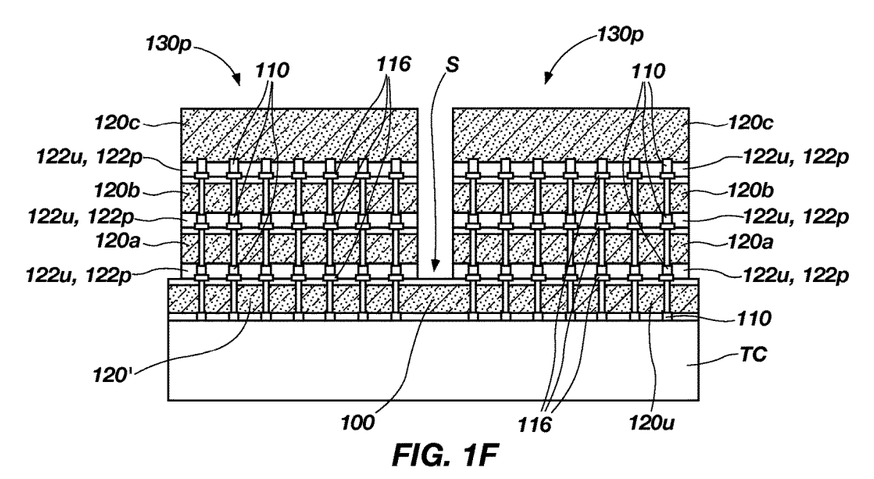
Figure 4:
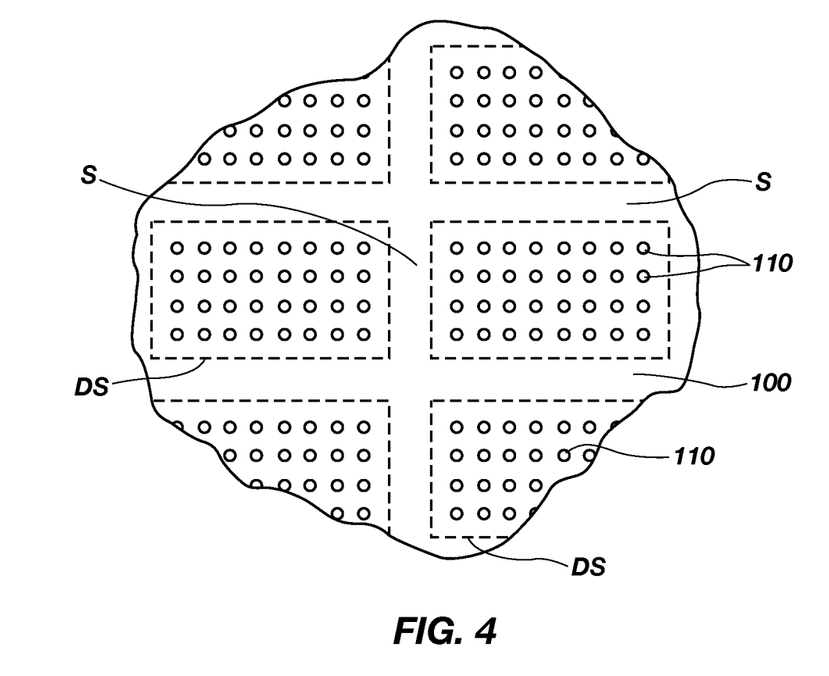
FIG. 4 schematically depicts a portion of an intact wafer upon which die stacks are formed, according to the present disclosure.

As shown in FIG. 1F, another level of singulated semiconductor dice 120*b* having an epoxy underfill 122*u* thereon is then disposed over each semiconductor die 120*a* with electrically conductive elements 110 of semiconductor die 120*b* in alignment with landing pads 116 of semiconductor die 120*a*. Further, a semiconductor die 120*c*, singulated from an unthinned wafer 100*a* and having an epoxy underfill 122*u* thereon is then disposed over each semiconductor die 120*b* with electrically conductive elements 110 of semiconductor die 120*c* in alignment with landing pads 116 of semiconductor die 120*b*. FIG. 4 shows die stack locations DS in broken lines on intact wafer 100, with streets S laterally separating one die stack location DS from others. Patterns of conductive elements 110 protruding from the surface of wafer 100 opposing the die stack locations DS are shown for reference.

The active surfaces of semiconductor dice 120*c* may face wafer 100. Stated another way, more than one level of semiconductor dice 120*a*, 120*b* and 120*c* are stacked sequentially over the locations of unsingulated dice 120*u*, to form stacks of semiconductor dice over each of these laterally separated locations DS. Active surfaces of each of semiconductor dice 120*a* through 120*c* may face wafer 100, although this is not a requirement and semiconductor dice 120*a* through 120*c* of mixed orientation may be employed. Accordingly, conductive elements 110 and landing pads 116 may be located on either surface of a die 120.

As noted above, all of the dice 120*u*, 120*a*, 120*b* and 120*c* used to form die stacks according to the present disclosure are qualified as KGD. However, there are die stack locations DS (FIG. 4) on intact wafer 100 where unsingulated semiconductor dice 120*u* fail to qualify as KGD. Since, as described below with respect to FIG. 1G, intact wafer 100 and stacked dice 120*a* through 120*c* of each stack are overmolded with an encapsulant material, it is desirable to form die stacks of a height equal to a height of the die stacks populated with KGD, over the locations DS of bad unsingulated dice 120*u* using other, bad dice singulated from other wafers. Such an approach provides the ability to maintain consistent volumes of encapsulant material for molding, for example, by compression molding, of each wafer assembly including die stacks. If there were different numbers of die sites populated with die stacks on each intact wafer, encapsulant volume would have to be adjusted to keep the same post-mold thickness of encapsulant material. Further, populating bad die stack locations DS with stacks of bad, singulated dice facilitates precise process control in terms of flow of molding material around and over the die stacks.

If metal pillars are employed as electrically conductive elements 110, thermocompression bonding is employed to provide robust mechanical and electrical connections between electrically conductive elements 110 and landing pads 116 and, thus, through the resulting die stack precursor structures 130*p*, each comprising an unsingulated semiconductor die 120*u* of wafer 100, and semiconductor dice 120*a* through 120*c* stacked thereon. The epoxy underfill 122*u* is cured.

As an alternative to the use of a pre-applied epoxy underfill, a non-conductive epoxy paste 122*p* may be dispensed over each unsingulated die 120*u* and a die 120*a* having electrically conductive elements 110 formed thereon, is disposed thereover with electrically conductive elements 110 aligned with landing pads 116 of unsingulated die 120*u*. The nonconductive epoxy paste 122*p*, which may include a solder flux if electrically conductive elements 110 comprise solder bumps, is displaced from between landing pads 116 and elements 110 by compression of die 120*a* against unsingulated die 120*u*. The stacking process of semiconductor dice 120*b* and 120*c* proceeds as described above; the solder bump electrically conductive elements 110 are partially reflowed to connect to landing pads 116; and the epoxy paste 122*p* is cured.

As an alternative to the use of a non-conductive paste or a pre-applied epoxy underfill, a flux may be applied to landing pads 116 of each die 120*u*, 120*a* and 120*b* when solder balls are employed as electrically conductive elements 110, the solder balls reflowed to bond to landing pads 116, then cooled and a non-conductive capillary underfill disposed between the dice 120*u*, 120*a*, 120*b* and 120*c* of each die stack precursor structure 130*p*. A non-conductive capillary underfill may also be employed with conductive elements 110 in the form of metal pillars.

Figure 1G:
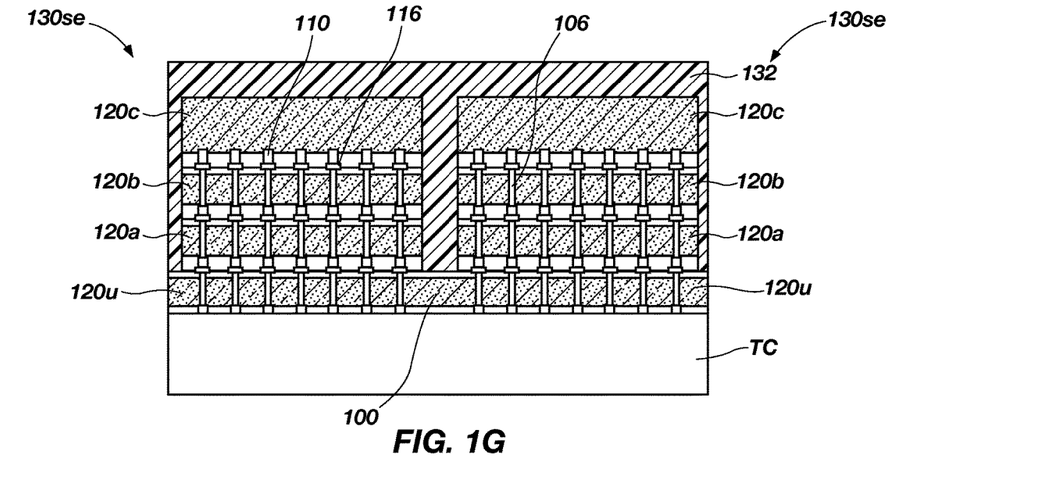

In FIG. 1G, stacked semiconductor dice 120*a* through 120*c* are overmolded in a wafer level molding process on intact wafer 100 using, for example, film assisted molding or compression molding of an electrically insulative, which may also be characterized as a dielectric, material to provide a covering structure 132 of encapsulation material over, around and between the stacks of semiconductor dice 120*a* through 120c and in contact with the intact wafer 100, forming a plurality of substantially encapsulated die stack precursor structures 130se on intact wafer 100. One particularly suitable technique is film assisted molding, as described in U.S. Pat. Nos. 7,595,017; 6,652,799; and 6,459,159.

Figure 1H:
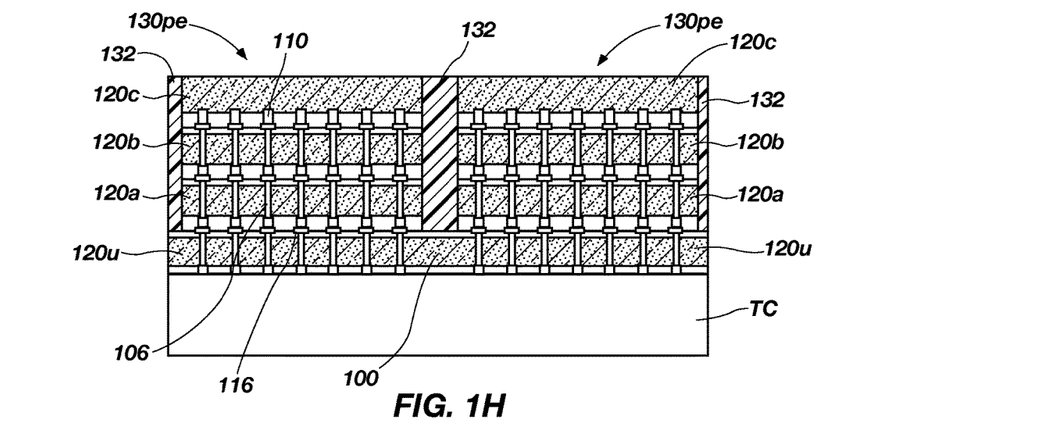

As shown in FIG. 1H, the assembly of intact wafer 100 with unsingulated, substantially encapsulated die stack precursor structures 130se thereon is back ground while mounted to temporary carrier TC, to remove a portion of encapsulation structure 132 over the uppermost level of semiconductor dice 120c to expose the semiconductor material thereof and to thin each semiconductor die 120c to a reduced thickness of, for example, about 50 µm, similar to the thicknesses of unsingulated semiconductor dice 120u and semiconductor dice 120a and 120b. The peripheral portions of encapsulation structure 132 remain around and between the die stack precursor structures, which may be described as peripherally encapsulated die stack precursor structures 130pe.

Figure 1I:
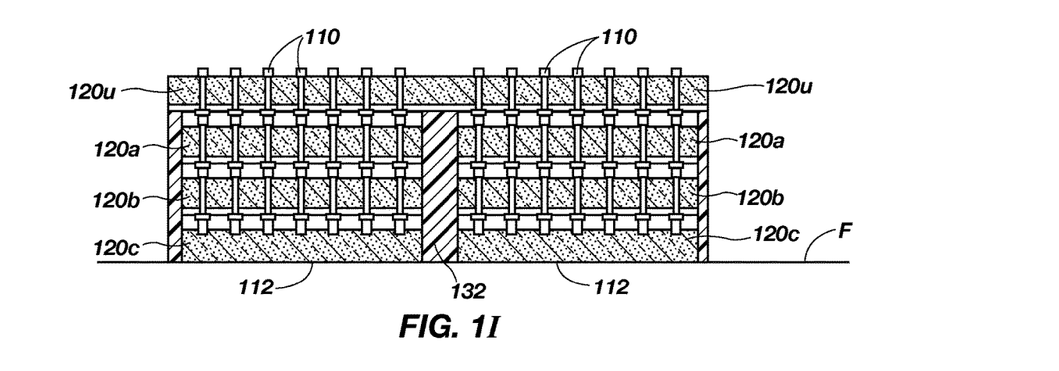

As shown in FIG. 1I, the temporary carrier TC is removed after intact wafer 100 including peripherally encapsulated die stack precursor structures 130pe is mounted to a conventional film frame F to orient the electrically conductive elements 110 of the unsingulated dice 120u of intact wafer 100 in a position to facilitate contact with test probes, a test of the semiconductor dice as assembled and electrically connected in their respective die stacks is performed, and locations of each good die stack as determined by a test noted and marked with an appropriate indicator (e.g., pin 1) and tracking code on the exposed surfaces (e.g., back sides 112) of semiconductor dice 120c. Such marking could be done using a laser. Of course, the locations of non-KGD unsingulated dice 120u are already known, and so the locations of bad die stacks comprising such unsingulated dice are already known.

Figure 1J:
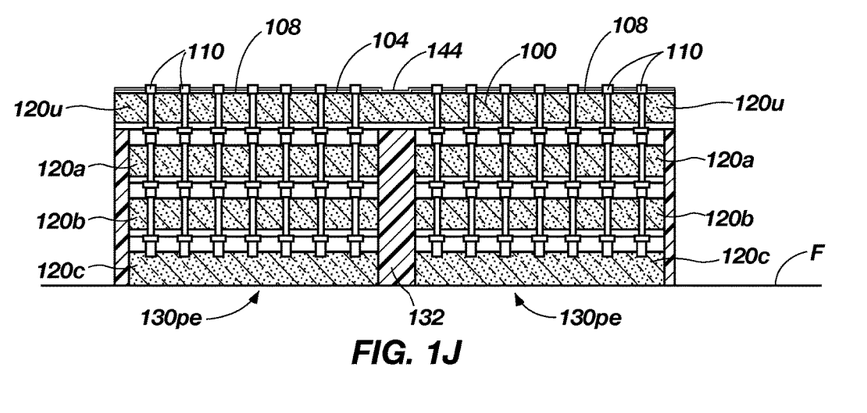
Figure 2A:
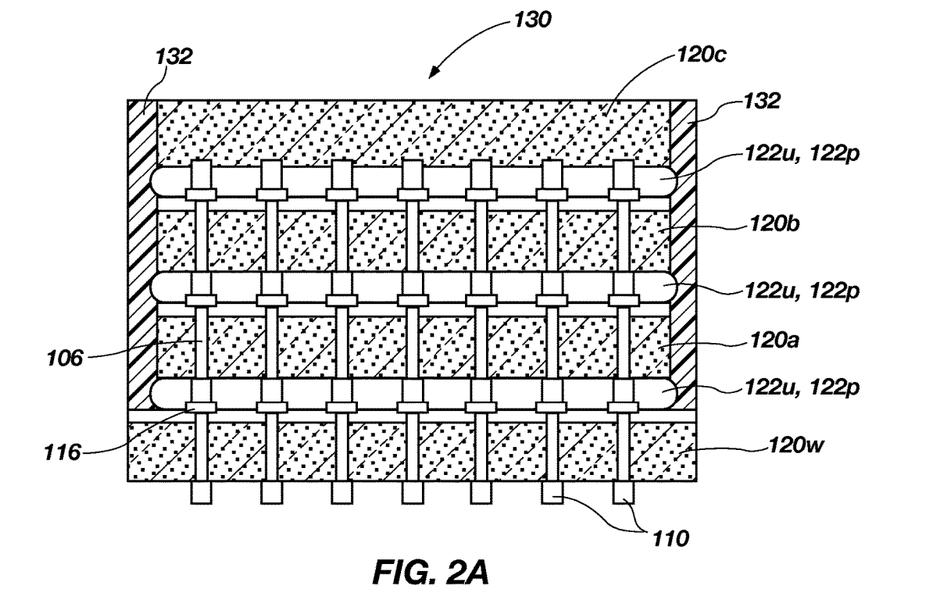
FIGS. 2A and 2B illustrate an embodiment of a semiconductor die assembly according to the present disclosure.
Figure 2B:
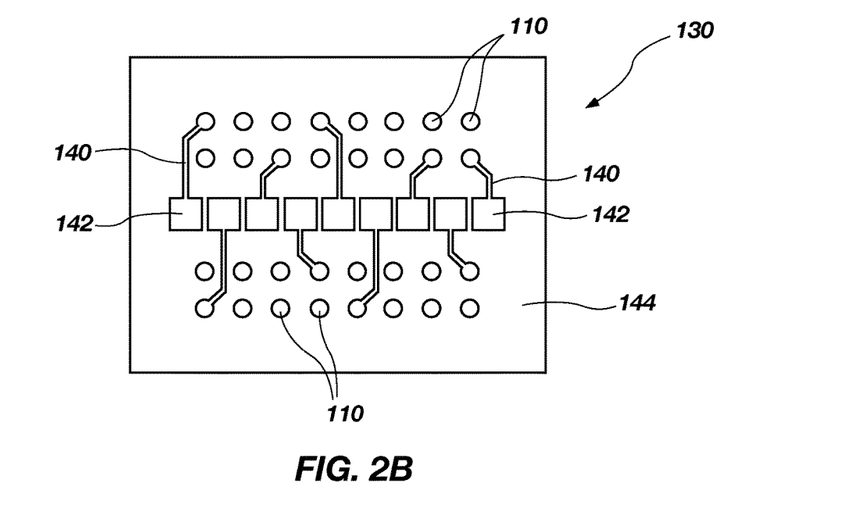

As shown in FIG. 1J and with reference to FIG. 2B, test pads 142, for example, of copper, may have been previously, optionally formed on intact wafer 100 in communication with conductive through vias 106 of each location of an unsingulated semiconductor die 120u in conjunction with formation of electrically conductive elements 110, as described above with respect to FIG. 1A. Test pads 142 and circuitry 140 (FIG. 2B) connecting the test pads 142 to conductive through vias 106 have been formed in conjunction with, and prior to, formation of electrically conductive elements 110. Electroplating of for example, copper over passivation material 108 followed by masking, patterning and etching may be used to form circuitry 140 leading from electrically conductive vias 106 to test pads 142 over passivation material 108 on the active surface 104 of each unsingulated semiconductor die 120u prior to formation of electrically conductive elements 110. The active surfaces of dice 120' may then be repassivated by application of another passivation 144, leaving the test pads 142 and ends of conductive vias 106 at least partially exposed by patterning. Electrically conductive elements 110 may then have been subsequently electroplated over, and connected to, conductive through vias 106. The active surface of intact wafer 100 may be facing away from the stacks of semiconductor dice 120a through 120c, but such an orientation is not required.

It is also contemplated that the die stacks may be tested prior to back grinding of the encapsulation structure 132 and thinning of semiconductor dice 120c to eliminate handling with a film frame. This may be done by removing the temporary carrier and inverting the assembly to access electrically conductive elements 110 of unsingulated semiconductor dice 120u.

Figure 1K:
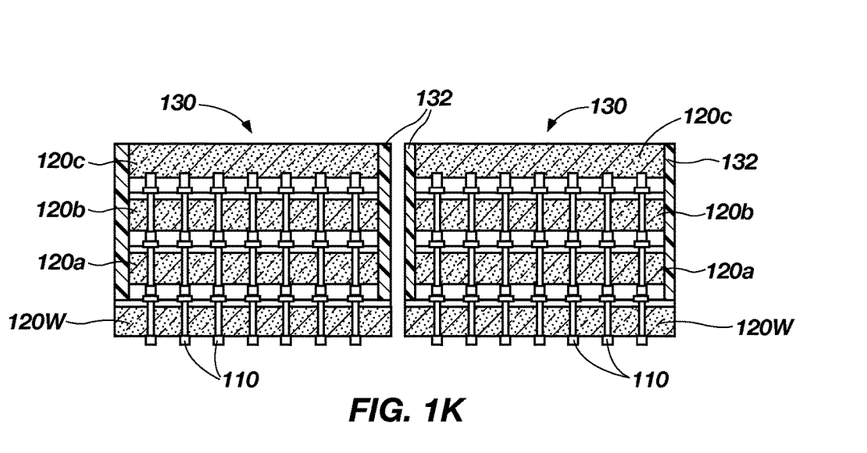

As shown in FIG. 1K, the assembly of intact wafer 100 populated with peripherally encapsulated die stack precursor structures 130pe on a film frame F is singulated through the encapsulant structure 132 and through the body of wafer 100 between the stacks of semiconductor dice 120a through 120c into completed stacked die packages 130, each comprising a base semiconductor die 120w singulated from formerly intact wafer 100 and semiconductor dice 120a through 120c stacked thereon, with encapsulation structure 132 peripherally encapsulating semiconductor dice 120a through 120c and in contact with base semiconductor die 120w.

Figure 1L:
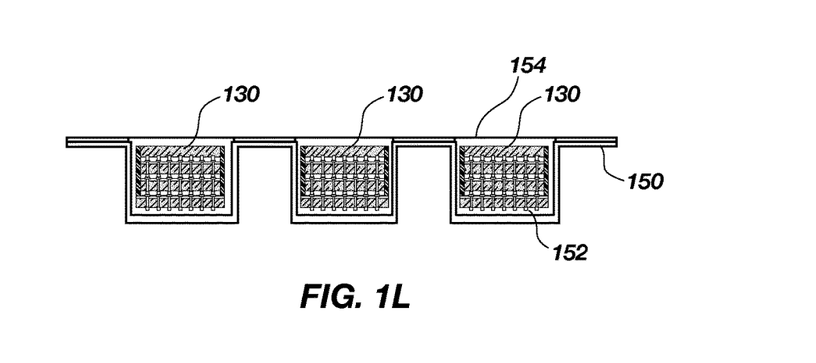

Following singulation, stacked die packages 130 comprising good die stacks may be removed from the film frame F by a pick-and-place apparatus and disposed in pockets 152 in a tape 150 and covered with protective overlay 154 as shown in FIG. 1L for use in a tape and reel device of a customer, and shipped to the customer.

FIG. 2A depicts a completed stacked die package 130 in side sectional elevation. FIG. 2B depicts a schematic bottom elevation of one embodiment of a completed stacked die package 130 including not only electrically conductive elements 110 but also optional traces 140 (shown for clarity, but hidden by passivation 144) and test pads 142 as described above with reference to FIG. 1J.

It should be noted that the semiconductor die 120w at the base of each completed stacked die package 130 is of greater lateral peripheral dimension than semiconductor dice 120a through 120c, which are surrounded by a peripheral collar 132 of encapsulant material in contact with the edge surface of base semiconductor die 120w peripherally exposed beyond semiconductor dice 120a through 120c. In one embodiment, the stack of semiconductor dice 120a through 120c is centered on semiconductor die 120w. The unencapsulated portions of completed stacked die package 130 may, as described below, be encapsulated after incorporation in a semiconductor device including a logic die or a SoC die.

An embodiment of a semiconductor die assembly of the disclosure comprises a base semiconductor die having conductive elements protruding from a surface, semiconductor dice of lesser lateral dimensions than the base semiconductor die stacked on an opposing surface of the base semiconductor die, an uppermost stacked die having an active surface facing the semiconductor die and having no conductive through vias. Conductive elements vertically connect all of the semiconductor dice of the assembly and a non-conductive material is located around the conductive elements and between adjacent semiconductor dice of the assembly. An encapsulant material extends peripherally about the semiconductor dice of lesser lateral dimensions and in contact with the opposing surface of the base semiconductor die.

In the foregoing embodiment, the completed stacked die package 130 may comprise functionally different semiconductor dice in addition to, or in lieu of, memory dice. In other words, the architecture of stacked die package 130 is adaptable to applications other than memory die stacks, and specifically MPGA packages as mentioned above. For example and without limitation, for computing applications base semiconductor die 120w may be a logic controller die, while dice 120a through 120c may be memory dice. As illustrated, each completed stacked die package 130 comprises four semiconductor dice, but the disclosure is not so limited and fewer or more semiconductor dice may be employed.

Figure 3A:
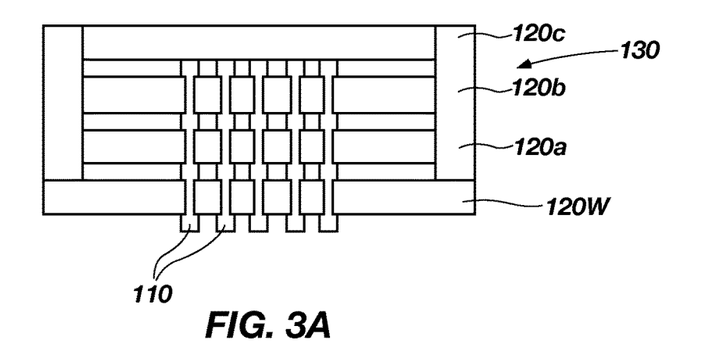
FIGS. 3A through 3C schematically illustrate a sequence for fabrication of a semiconductor device including a stacked die structure according to embodiments of the present disclosure, and the resulting semiconductor device.
Figure 3B:
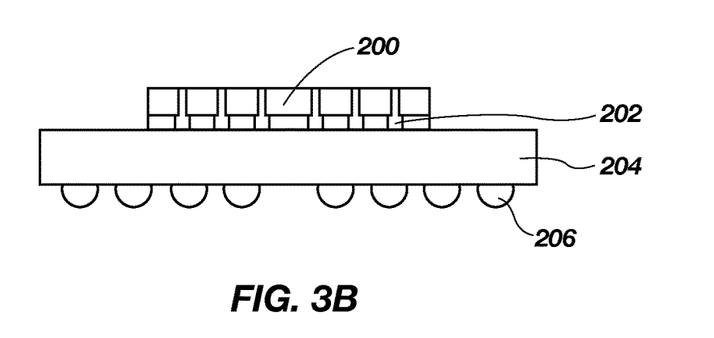
Figure 3C:
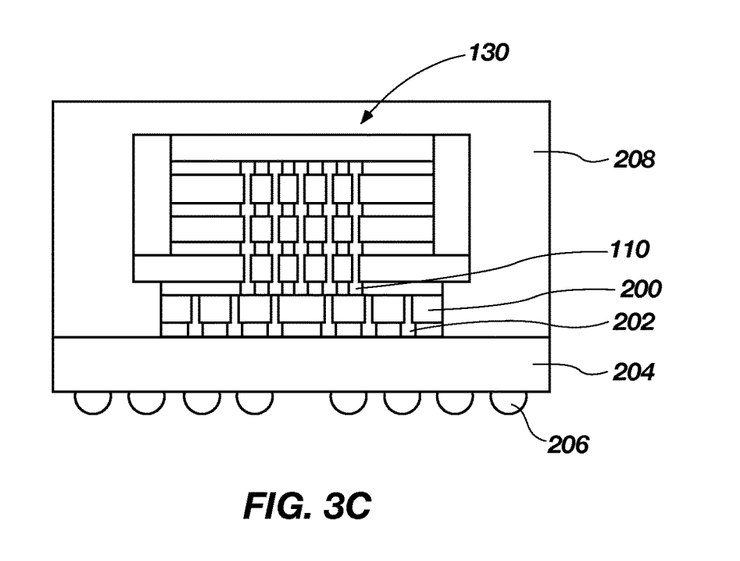

Referring now to FIGS. 3A through 3C, FIG. 3A depicts a schematic of a stacked die package 130 according to an embodiment of the disclosure and as previously described herein, respectively, with regard to FIGS. 2A and 2B. In FIG. 3B, a logic die or a SoC die, designated as 200, is schematically depicted mounted and electrically connected by conductive elements 202 to traces (not shown) of a carrier substrate, such as a ball grid array (BGA) substrate 204, having conductive elements 206, for example, solder balls, extending therefrom for connection to higher-level packaging. FIG. 3C depicts a stacked die package 130 mounted and electrically connected to the logic die or the SoC die 200 and overmolded with a dielectric encapsulant material 208. As depicted in FIG. 3C, stacked die package 130 may be of greater lateral extent than logic die or SoC die 200, with encapsulant material 208 extending over and around stacked die package 130, filling a peripheral recess between stacked die package 130 and carrier substrate 204 around the logic die or the SoC die 200 and in contact with BGA substrate 204.

An embodiment of a semiconductor device of the disclosure comprises a carrier substrate comprising external connections on a surface, and a logic die or a system on a chip die mounted on an opposing surface of the carrier substrate and operably coupled to the external connections, an assembly mounted to the logic die or the system on a chip die, the assembly comprising a base semiconductor die having conductive elements protruding from a surface, semiconductor dice of lesser lateral dimensions than the base semiconductor die stacked on an opposing surface of the base semiconductor die, an uppermost stacked die having an active surface facing the semiconductor die and having no conductive through vias, conductive elements vertically connecting all of the semiconductor dice of the assembly, and a dielectric material surrounding the conductive elements between adjacent semiconductor dice. At least one encapsulant material extends over uppermost stacked die, peripherally about the stacked semiconductor dice, the base semiconductor die and the logic die or the system on a chip die and in contact with the opposing surface of the carrier substrate.

CONCLUSION

A method of forming a semiconductor die assembly is disclosed, comprising stacking at least one level of semiconductor dice having conductive through vias over unsingulated, laterally separated semiconductor die locations of a wafer, after which another level of semiconductor dice without conductive through vias is stacked over uppermost semiconductor dice of the at least one level. Semiconductor dice in each level and an associated unsingulated semiconductor die location are connected with conductive elements, and a dielectric material is placed between the semiconductor dice of each stack and the associated unsingulated die location. At least a periphery of each stack of semiconductor dice is substantially covered with encapsulant material between the stacks and onto the wafer, and the stacks of semiconductor dice are singulated through the encapsulant material between the stacks of semiconductor dice and through the wafer.

Another method of forming a semiconductor die assembly is disclosed, comprising forming stacks of semiconductor dice over laterally separated semiconductor die locations of a wafer, an uppermost semiconductor die of each stack having an active surface facing the wafer and having no conductive through vias. Semiconductor dice in each stack and of a semiconductor die location under each stack are vertically connected with conductive elements and a dielectric material placed around the conductive elements. Each stack is substantially simultaneously encapsulated with a molded dielectric material over and between the stacks in contact with the wafer, the dielectric material over the stacks is removed and the uppermost semiconductor die of each stack thinned, after which the dielectric material and the wafer are severed between the stacks.

A semiconductor die assembly is disclosed, comprising a base semiconductor die having conductive elements protruding from a surface, semiconductor dice of lesser lateral dimensions than the base semiconductor die stacked on an opposing surface of the base semiconductor die, an uppermost stacked die having an active surface facing the semiconductor die and having no conductive through vias. Conductive elements vertically connect all of the semiconductor dice of the assembly, and a non-conductive material is located around the conductive elements and between adjacent semiconductor dice of the assembly. An encapsulant material extends peripherally about the semiconductor dice of lesser lateral dimensions and in contact with the opposing surface of the base semiconductor die.

A semiconductor device is disclosed, comprising a carrier substrate comprising external connections on a surface and a logic die or a system on a chip die mounted on an opposing surface of the carrier substrate and operably coupled to the external connections. An assembly is mounted to the logic die or the system on a chip die and comprises a base semiconductor die having conductive elements protruding from a surface, semiconductor dice of lesser lateral dimensions than the base semiconductor die being stacked on an opposing surface of the base semiconductor die, an uppermost stacked die having an active surface facing the semiconductor die and having no conductive through vias. Conductive elements vertically connect all of the semiconductor dice of the assembly and a dielectric material surrounds the conductive elements between adjacent semiconductor dice. At least one encapsulant material extends over uppermost stacked die, peripherally about the stacked semiconductor dice, the base semiconductor die and the logic die or the system on a chip die and in contact with the opposing surface of the carrier substrate.

While the disclosure is susceptible to various modifications and alternative forms, specific embodiments have been shown by way of example in the drawings and have been described in detail herein. However, the disclosure is not intended to be limited to the particular forms disclosed. Rather, the invention encompasses all modifications, equivalents, and alternatives falling within the scope of the invention as defined by the following appended claims and their legal equivalents.

What is claimed is:

1. A method of forming a semiconductor die assembly, comprising:

stacking at least one level of mutually laterally spaced semiconductor dice previously thinned from an initial wafer thickness and comprising integrated circuitry and having conductive through vias over unsingulated, mutually laterally separated semiconductor die locations of a semiconductor wafer previously thinned from the initial wafer thickness, each semiconductor die location comprising integrated circuitry, having conductive through vias and having conductive elements on a surface thereof opposite the at least one level of mutually laterally spaced semiconductor dice;
stacking another level of mutually laterally spaced semiconductor dice of the initial wafer thickness and comprising integrated circuitry, without conductive through vias, and of a same length and width as a length and width of the semiconductor dice of the at least one level over uppermost semiconductor dice of the at least one level with active surfaces facing toward the semiconductor wafer;
vertically operably connecting integrated circuitry of semiconductor dice in each level of a stack and integrated circuitry of an associated semiconductor die location with conductive elements between the semiconductor dice of the stack and the conductive through vias within the semiconductor dice of the at least one level and through conductive elements between a lowermost semiconductor die of the stack and the conductive through vias of the associated semiconductor die location to the conductive elements on the opposite surface of the associate semiconductor die location;
placing a dielectric material between the semiconductor dice of each stack and between a semiconductor die of each stack and the associated unsingulated die location to surround the conductive elements and substantially fill space between the semiconductor dice of each stack and between a semiconductor die of each stack and the associated unsingulated die location;
substantially simultaneously placing encapsulant material over and around each stack of semiconductor dice, contacting and covering a lateral periphery of each stack of semiconductor dice and the dielectric material with the encapsulant material extending between the stacks and onto the wafer; and
removing the encapsulant material from over the another level of semiconductor dice;
reducing the initial wafer thickness of the semiconductor dice of the another level from the initial wafer thickness to a thickness substantially the same to thicknesses of the previously thinned mutually laterally spaced semiconductor dice and the previously thinned semiconductor wafer; and
singulating the stacks of semiconductor dice through the encapsulant material extending between the stacks of semiconductor dice and through the semiconductor wafer between the mutually laterally separated semiconductor die locations.

2. The method of claim 1, wherein stacking at least one level of semiconductor dice comprises stacking more than one level of semiconductor dice.

3. The method of claim 1, wherein removing the encapsulant material from over the another level of semiconductor dice and reducing the initial wafer thickness of the semiconductor dice of the another level comprises back grinding.

4. The method of claim 1, further comprising, before singulating the stacks of semiconductor dice through the encapsulant material extending between the stacks of semiconductor dice and through the wafer:
thinning the semiconductor dice of the another level;
conducting a test of each die stack; and
marking, as determined by a test, good die stack locations on exposed surfaces of the another level of semiconductor dice.

5. The method of claim 1, further comprising orienting semiconductor dice of each stack with active surfaces thereof facing toward the wafer.

6. The method of claim 1, wherein stacking semiconductor dice over mutually laterally separated, unsingulated semiconductor die locations comprises stacking semiconductor dice having conductive elements extending from active surfaces thereof.

7. The method of claim 1, further comprising:
forming circuit traces extending from and in communication with conductive through vias of each unsingulated semiconductor die location over a surface of the wafer facing away from the semiconductor die stacks to test pads located over the surface of the wafer facing away from the semiconductor die stacks and laterally offset from the conductive through vias;
applying passivation over the surface and leaving only the pads and ends of conductive through vias of the unsingulated semiconductor die locations exposed: and
forming conductive elements only directly on and connected to conductive through vias of each unsingulated semiconductor die location.

8. The method of claim 1, further comprising facing an active surface of the wafer away from the semiconductor die stacks.

9. The method of claim 1, wherein vertically connecting semiconductor dice in each level and an associated unsingulated semiconductor die location with conductive elements is effected using one of thermocompression bonding and solder reflow.

10. A method of forming a semiconductor die assembly, comprising:
forming laterally spaced stacks of semiconductor dice, each comprising integrated circuitry, over laterally separated semiconductor die locations of a semiconductor wafer, each semiconductor die location comprising integrated circuitry, having conductive through vias and having conductive elements on an opposing side thereof from the stacks, an uppermost semiconductor die of each stack having an active surface facing the wafer and having no conductive through vias, and other semiconductor dice of each stack having conductive through vias;
vertically operably connecting integrated circuitry of semiconductor dice in each stack and integrated circuitry of a semiconductor die location under each stack with conductive elements and conductive through vias and placing a dielectric material around the conductive elements;
substantially simultaneously encapsulating each stack of semiconductor dice with a molded dielectric material over, in contact with, and between the stacks of semiconductor dice and in contact with the wafer;
removing a portion of the dielectric material extending over the stacks of semiconductor dice and thinning the uppermost semiconductor die of each stack;
conducting a test of each stack; marking, as determined by a test, good stack locations on back sides of the uppermost die of each good stack; and
severing the dielectric material and the semiconductor wafer between the stacks of semiconductor dice to form semiconductor die assemblies.

11. The method of claim 10, wherein forming stacks of semiconductor dice comprises forming stacks comprising more than two semiconductor dice.

12. The method of claim 10, wherein removing a portion of the dielectric material extending over the stacks of semiconductor dice and thinning the uppermost semiconductor die of each stack comprises back grinding.

13. The method of claim 10, further comprising orienting all semiconductor dice of each stack with active surfaces thereof facing toward the wafer.

14. The method of claim 10, wherein forming stacks of semiconductor dice over laterally separated semiconductor die locations comprises stacking semiconductor dice having conductive elements extending from active surfaces thereof.

15. The method of claim 10, further comprising:
- forming circuit traces extending from and in communication with conductive through vias of each semiconductor die location over a surface of the wafer facing away from the stacks to test pads located over the surface of the wafer facing away from the semiconductor die stacks and laterally offset from the conductive through vias;
- applying passivation over the active surface and leaving only the pads and ends of conductive through vias of the semiconductor die locations exposed: and
- forming conductive elements only on and connected to conductive through vias of each laterally separated semiconductor die location.

16. The method of claim 10, wherein vertically connecting semiconductor dice in each stack and of a semiconductor die location under each stack with conductive elements is effected using one of thermocompression bonding and solder reflow.

* * * * *

UNITED STATES PATENT AND TRADEMARK OFFICE
CERTIFICATE OF CORRECTION

PATENT NO. : 9,711,494 B2
APPLICATION NO. : 14/600976
DATED : July 18, 2017
INVENTOR(S) : Luke G. England, Paul A. Silvestri and Michael Koopmans

Page 1 of 1

It is certified that error appears in the above-identified patent and that said Letters Patent is hereby corrected as shown below:

In the Specification
    Column 1, Line 10, before "Embodiments of the present disclosure" insert title --TECHNICAL FIELD--
    Column 7, Line 49, change "Electroplating of for" to --Electroplating of, for--

In the Claims
Claim 1, Column 11, Line 21, change "associate semiconductor die" to --associated semiconductor die--

Signed and Sealed this
Twenty-sixth Day of September, 2017

Joseph Matal
*Performing the Functions and Duties of the*
*Under Secretary of Commerce for Intellectual Property and*
*Director of the United States Patent and Trademark Office*